United States Patent
Liu et al.

(10) Patent No.: US 10,622,220 B1
(45) Date of Patent: Apr. 14, 2020

(54) NANOFLUIDIC CHANNEL FABRICATION BY CONTROLLED SPONTANEOUS FRACTURING

(71) Applicant: INTERNATIONAL BUSINESS MACHINES CORPORATION, Armonk, NY (US)

(72) Inventors: Xiao Hu Liu, Yorktown Heights, NY (US); Huan Hu, Haining (CN); Jianshi Tang, Elmsford, NY (US); Ning Li, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/186,529

(22) Filed: Nov. 10, 2018

(51) Int. Cl.
    *H01L 21/31*     (2006.01)
    *H01L 21/3105*     (2006.01)
    *H01L 21/02*     (2006.01)
    *H01L 21/3205*     (2006.01)

(52) U.S. Cl.
    CPC .... *H01L 21/3105* (2013.01); *H01L 21/02118* (2013.01); *H01L 21/32051* (2013.01)

(58) Field of Classification Search
None
See application file for complete search history.

(56) References Cited

U.S. PATENT DOCUMENTS

| | | |
|---|---|---|
| 8,841,203 B2 | 9/2014 | Bedell et al. |
| 2004/0110199 A1 | 6/2004 | Montemagno et al. |

FOREIGN PATENT DOCUMENTS

| | | |
|---|---|---|
| CN | 102050427 B | 6/2013 |
| CN | 104326433 B | 5/2016 |
| KR | 101309452 B1 | 9/2013 |

OTHER PUBLICATIONS

Kim, B.C. et al. "Guided fracture of films on soft substrates to create micro/nano-feature arrays with controlled periodicity." Scientific reports. Oct. 2013, vol. 3 pp. 3027 et seq.
Nam, K.H. et al. "Patterning by controlled cracking." Nature. May 2012, vol. 485(7397) pp. 221-224.
Alaca, B.E., et al. "Guided self-assembly of metallic nanowires and channels." Applied Physics Letters. Jun. 2004, vol. 84(23) pp. 4669-4671.
Hutchinson, J.W., et al., "Mixed Mode Cracking in Layered Materials", Advances in Applied Mechanics 29. Jan. 1991. pp. 63-191.

*Primary Examiner* — Hrayr A Sayadian
(74) *Attorney, Agent, or Firm* — Vazken Alexanian; Otterstedt, Wallace & Kammer, LLP

(57) ABSTRACT

A combined nanofluidic and integrated circuit device includes a semiconductor wafer, which includes a substrate with active circuitry formed in the substrate; an oxide layer deposited adjacent the active circuitry; a stressor film deposited onto or into the oxide layer in sections, wherein the stressor film has a higher coefficient of thermal expansion than the oxide layer has; and a nanochannel formed in the oxide layer between the sections of the stressor film. According to an exemplary embodiment, the nanochannel is formed in the oxide layer by cooling the oxide layer and the stressor film to a fracture propagation temperature that is less than first and second temperatures at which the oxide layer and the stressor film are deposited on the substrate.

20 Claims, 4 Drawing Sheets

NANOFLUIDIC CHANNEL FABRICATION BY CONTROLLED SPONTANEOUS FRACTURING

BACKGROUND

The present invention relates to nanoscale fabrication, and more specifically, to fabrication of devices that integrate nanofluidic channels with semiconductor devices.

Currently, fluidic devices make use of microchannels, i.e. channels of approximately one micrometer or greater dimension in the smallest direction. Typical existing fabrication methods for microchannels rely directly or indirectly on the use of electron beam lithography or focused ion milling. Attempts have been made to form microchannels by fracturing a substrate.

SUMMARY

Principles of the invention provide techniques for nanofluidic channel fabrication by controlled spontaneous fracturing. As used herein, "fracturing" is synonymous with "mechanical cracking" and cracking is intended to refer to mechanical cracking. In one aspect, an exemplary method for fabricating a nanochannel in an oxide layer on a semiconductor wafer includes depositing the oxide layer onto the wafer at a first temperature; forming a microfracture in the oxide layer; depositing a stressor film onto the oxide layer in sections that adjoin the microfracture at opposite sides, at a second temperature; cooling the oxide layer and the stressor film to a fracture propagation temperature that is less than the first and second temperatures; and holding the oxide layer and the stressor film at the fracture propagation temperature while the nanochannel propagates as a fracture from the microfracture as directed by the shape of the stressor film.

According to another aspect of the invention, a combined nanofluidic and integrated circuit device includes a semiconductor wafer that includes a substrate with active circuitry formed in the substrate; an oxide layer deposited adjacent the active circuitry; a stressor film deposited onto or into the oxide layer in sections, wherein the stressor film has a higher coefficient of thermal expansion than the oxide layer has; and a nanochannel formed in the oxide layer between the sections of the stressor film. In one or more embodiments, the device also includes a first fluid cavity formed in the oxide layer at a first side of the stressor film and a second fluid cavity formed in the oxide layer at a second side of the stressor film, and the nanochannel fluidly connects the first fluid cavity to the second fluid cavity.

In view of the foregoing, techniques of the present invention can provide substantial beneficial technical effects. For example, one or more embodiments provide one or more of:

Batch process fabrication of nanofluidic channel devices.

Rapid fabrication of nanochannels with well-controlled shapes and dimensions.

Fabrication of nanochannels on a same substrate as complementary metal-oxide-semiconductor (CMOS) technology.

These and other features and advantages of the present invention will become apparent from the following detailed description of illustrative embodiments thereof, which is to be read in connection with the accompanying drawings.

DETAILED DESCRIPTION

In one or more embodiments, optical lithography is used to pattern submicron or micron scale stressor film onto an oxide layer of a semiconductor wafer in order to drive fracture propagation spontaneously in the oxide layer. In the oxide layer, a sharp tip notch of length in submicron or micron dimension acts as an initiation site for a channel fracture that forms spontaneously between sections of the stressor film. The channel fracture has a width of a few to hundreds of nanometers, and can be controlled precisely with thermal anneal and metal patterns. For example, the semiconductor wafer is chilled below operational temperature range to induce tensile stress between the sections of the stressor film, which drives the propagation of the fracture from the sharp tip notch along an opening between the stressor film sections. The fabrication process is complementary-metal-oxide-semiconductor (CMOS) compatible, making it easy to implement very large scale integrated (VLSI) circuits close to nanofluidic channels for molecule control (electrostatic valving) and signal processing.

Figure 1:
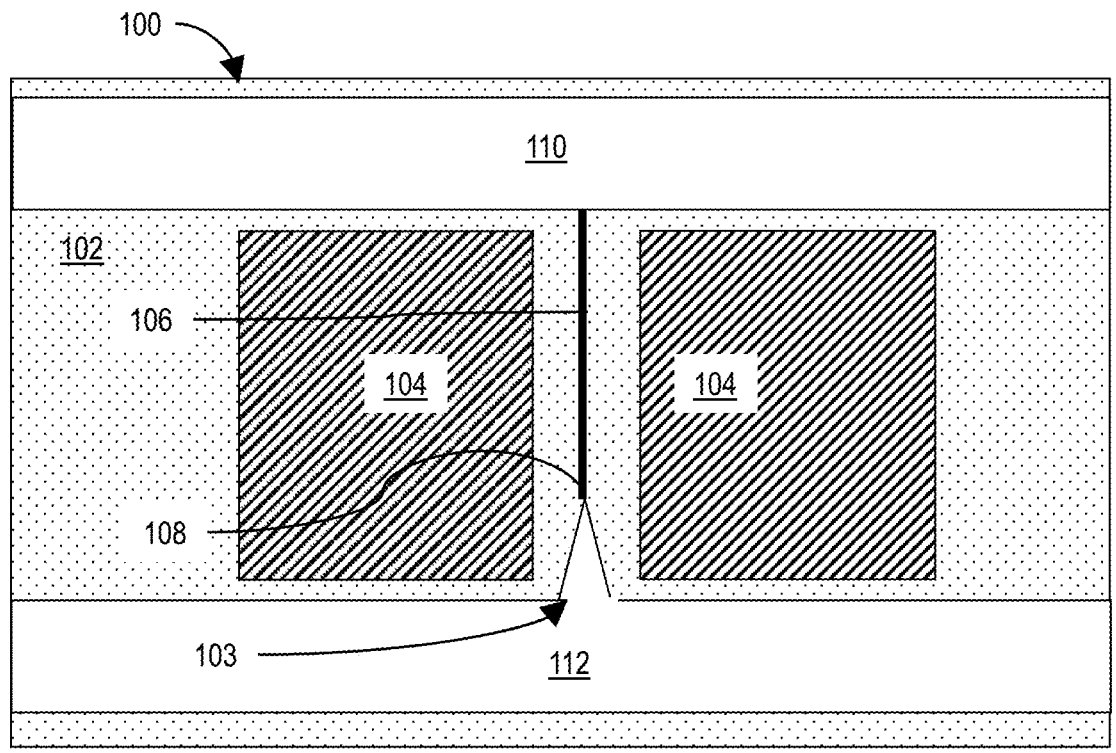
FIG. 1 depicts a top-down view of a semiconductor wafer including a microfracture, a sectioned stressor film, and a nanochannel fabricated according to exemplary embodiments.
Figure 2:
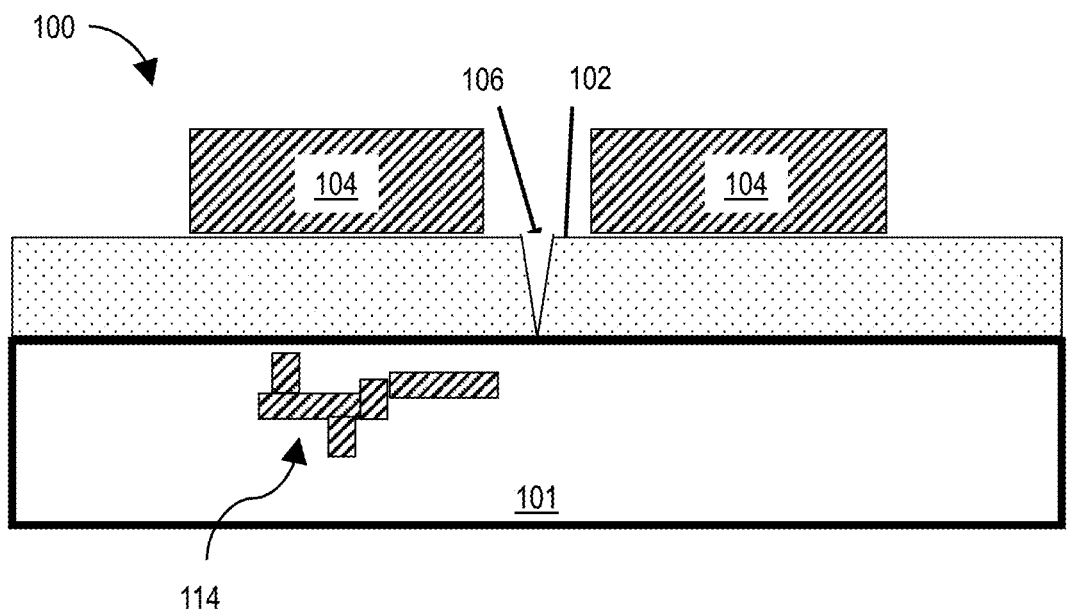
FIG. 2 depicts a cross-section view of one exemplary embodiment for producing the nanochannel shown in FIG. 1.

FIG. 1 depicts a top-down view of a semiconductor wafer 100; FIG. 2 depicts a side sectional view of the semiconductor wafer. The wafer 100 includes a substrate 101, an oxide layer 102 deposited on the substrate, a microfracture 103 that is formed in the oxide layer (either during deposition or by etching or other removal technique following deposition), a stressor film 104 that is deposited in sections (e.g., metal plates) on the oxide layer adjacent to the microfracture, and a nanochannel 106 that is fabricated according to exemplary embodiments. The nanochannel 106 fluidly connects a sharp tip 108 of the microfracture 103 to a cavity 110, which is on the other side of the oxide layer 102 from another cavity 112 that fluidly connects to the microfracture. Active circuitry 114 is formed within the substrate 101.

Although generally described as an oxide layer 102, embodiments of the invention may comprise a semiconductor material, a glass, a ceramic, or any another material whose fracture toughness is less than that of the substrate 101 and less than that of the stressor film 104 to be subsequently formed. Fracture toughness is a property which describes the ability of a material containing a fracture to resist fracture. Fracture toughness is denoted $K_{Ic}$. The subscript IC denotes mode I fracture opening under a normal tensile stress perpendicular to the fracture, and C signifies that it is a critical value. Fracture toughness is a quantitative way of expressing a material's resistance to brittle fracture when a fracture is present.

Optionally, a metal-containing adhesion layer (not shown) can be deposited between the oxide layer 102 and the stressor film 104 in embodiments in which the stressor film to be subsequently formed has poor adhesion to the material of the oxide layer 102. Typically, the optional metal-containing adhesion layer is employed when a stressor film 104 formed of a metal is employed.

The optional metal-containing adhesion layer employed in one or more embodiments of the present invention includes any metal adhesion material such as, but not limited to, Ti/W, Ti, Cr, Ni or any combination thereof. The optional metal-containing adhesion layer may comprise a single layer or it may include a multilayered structure comprising at least two layers of different metal adhesion materials.

The optional metal-containing adhesion layer can be formed at room temperature (15° C.-40° C.) or above. In one embodiment, the optional metal-containing adhesion layer is formed at a temperature which is from 20° C. to 180° C. In another embodiment, the optional metal-containing adhesion layer is formed at a temperature which is from 20° C. to 60° C.

The optional metal-containing adhesion layer can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer typically has a thickness of from 5 nm to 200 nm, with a thickness of from 100 nm to 150 nm being more typical. Other thicknesses for the optional metal-containing adhesion layer that are below and/or above the aforementioned thickness ranges can also be employed in embodiments of the present invention.

Although generally described as a metal stressor film 104, the stressors employed in embodiments of the present invention may include any material that is under tensile stress while present atop the oxide layer 102 at fracture propagation temperature. Illustrative examples of such materials that can be employed as the stressor film include, but are not limited to, a metal, a polymer, such as a fracture inducing tape layer, or any combination thereof. The stressor film 104 may comprise a single stressor film, or a multilayered stressor structure including at least two layers of different stressor material can be employed.

Figure 3:
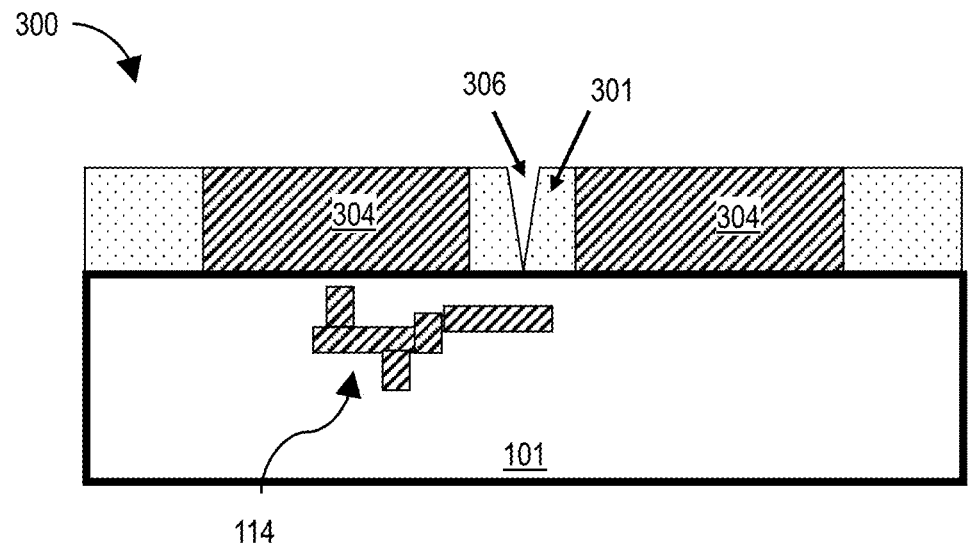
FIG. 3 depicts a cross-section view of another exemplary embodiment for producing the nanochannel shown in FIG. 1.
Figure 4:
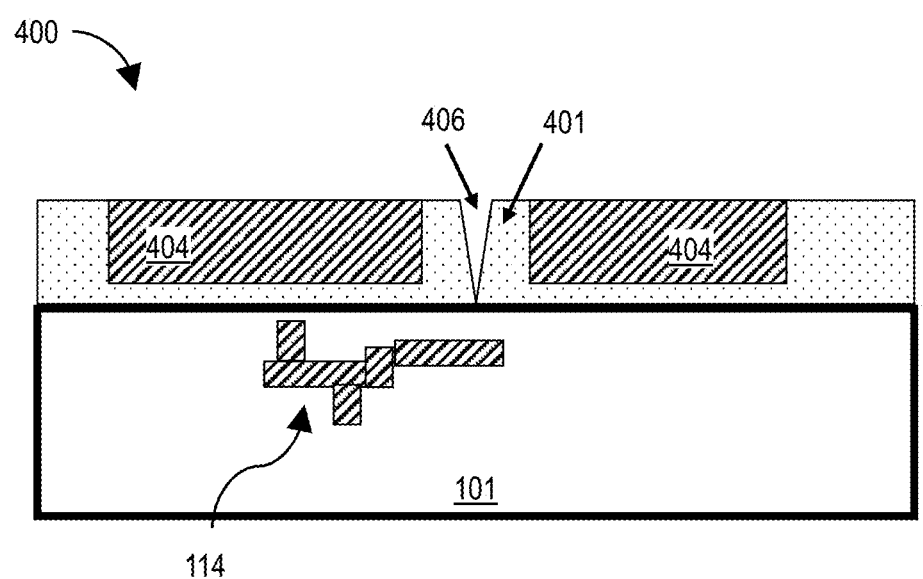
FIG. 4 depicts a cross-section view of another exemplary embodiment for producing the nanochannel shown in FIG. 1.
Figure 5:
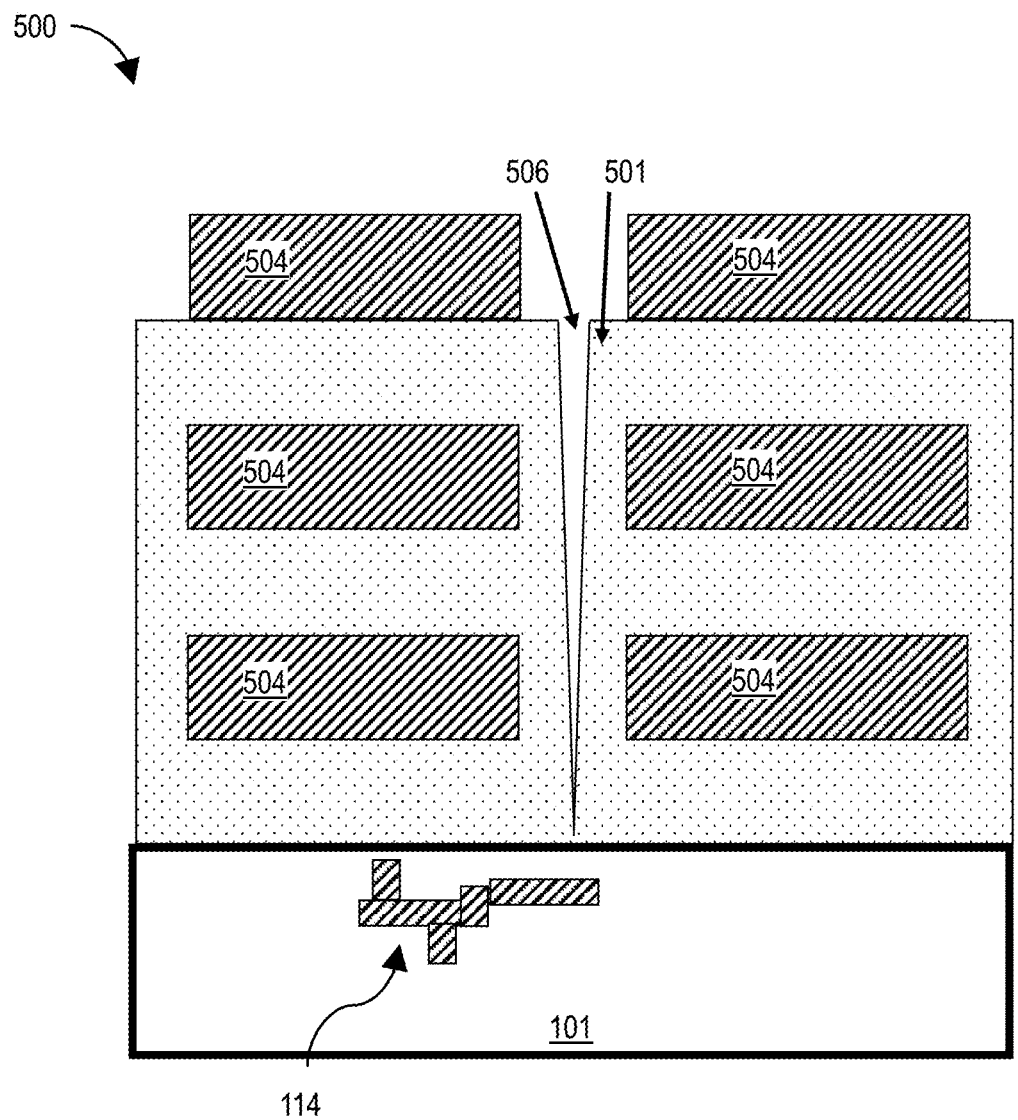
FIG. 5 depicts a cross-section view of yet another exemplary embodiment for producing the nanochannel shown in FIG. 1.

In one embodiment, as shown in FIG. 2, the stressor film 104 is a metal, and the metal is formed on an upper surface of the optional metal-containing adhesion layer. In another embodiment, the stressor film 104 is a fracture inducing tape, and the tape is applied directly to the oxide layer 102. In another embodiment, for example, the stressor film 104 may comprise a two-part stressor film including a lower part and an upper part. The upper part of the two-part stressor film can be comprised of a fracture inducing tape layer. In another embodiment 300, as shown in FIG. 3, the stressor film 304 is embedded into the oxide layer to full depth of the oxide layer. In another embodiment 400, as shown in FIG. 4, the stressor film 404 is embedded into the oxide layer to less than full depth of the oxide layer. In another embodiment 500, as shown in FIG. 5, multiple layers of the stressor film 504 are embedded into the oxide layer in a stacked sandwich manner.

When a metal is employed as the stressor film 104, the metal can include, for example, Ni, Cr, Fe or W. Alloys of these metals can also be employed. In one embodiment, the stressor film 104 includes at least one layer consisting of Ni.

When a polymer is employed as the stressor film 104, the polymer is a large macromolecule composed of repeating structural units. These subunits are typically connected by covalent chemical bonds. Illustrative examples of polymers that can be employed as the stressor film 104 include, but are not limited to, polyimides, polyesters, polyolefins, polyacrylates, polyurethane, polyvinyl acetate, and polyvinyl chloride.

When a fracture inducing tape layer is employed as the stressor film 104, the tape layer includes any pressure sensitive tape that is flexible, soft, and stress free at the temperature used to form the tape, yet strong, ductile and tensile at the temperature used during fracture propagation. By "pressure sensitive tape," it is meant an adhesive tape that will stick with application of pressure, without the need for solvent, heat, or water for activation. Tensile stress in the tape at the fracture propagation temperature is primarily due to thermal expansion mismatch between the oxide layer 102 (with a lower thermal coefficient of expansion) and the tape layer 104 (with a higher thermal expansion coefficient).

Typically, the pressure sensitive tape that is employed in one or more embodiments of the present invention as stressor film 104 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor film 104 that is employed in one or more embodiments of the present invention is formed at a temperature which is at room temperature (15° C.-40° C.). In another embodiment, when a tape layer is employed, the tape layer can be formed at a temperature which is from 15° C. to 60° C.

When the stressor film 104 is a metal or polymer, the stressor film 104 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor film 104 is a fracture inducing tape layer, the tape layer can be applied by hand or by mechanical means to the structure. The fracture inducing tape can be formed utilizing techniques well known in the art or they can be commercially purchased from any well-known adhesive tape manufacturer. Some examples of fracture inducing tapes that can be used in one or more embodiments of the present invention as stressor film 104 include, for example, Nitto Denko 3193MS thermal release tape, Kapton KPT-1, and Diversified Biotech's CLEAR-170 (acrylic adhesive, vinyl base).

In one embodiment, a two-part stressor film 104 can be formed on a surface of the oxide layer 102, wherein a lower part of the two-part stressor film is formed at a first temperature which is at room temperature or slightly above (e.g., from 15° C. to 60° C.), wherein an upper part of the two-part stressor film comprises a fracture inducing tape layer formed at an auxiliary temperature which is at room temperature.

The thickness of the stressor film 104 may be chosen to provide the desired fracture depth within the oxide layer 102. For example, if the stressor film 104 is chosen to be Ni, then fracture will occur to a depth below the stressor film roughly 2 to 3 times the Ni thickness. The stress value for the stressor film 104 is then chosen to satisfy the critical condition for fracture propagation mode fracture. This can be estimated by the fracture energy, according to theory set forth in a technical paper by J. W. Hutchinson and Z. Suo titled "Mixed Mode Cracking in Layered Materials", Advances in Applied Mechanics vol. 29, Academic Press 1992.

If the stressor film 104 is of a metallic nature, it typically has a thickness of from 3 µm to 50 µm, with a thickness of from 4 µm to 8 µm being more typical. Other thicknesses for a metallic stressor film that are below and/or above the aforementioned thickness ranges can also be employed in one or more embodiments of the present invention.

If the stressor film 104 is of a polymeric nature, it typically has a thickness of from 10 µm to 200 µm, with a thickness of from 50 µm to 100 µm being more typical. Other thicknesses for a polymeric stressor film that are below and/or above the aforementioned thickness ranges can also be employed in one or more embodiments of the present invention.

Notably, the drawing figures depict embodiments of the invention following a controlled fracture propagation process that is achieved by subjecting the stressor film 104 and the oxide layer 102 to temperatures below the deposition temperature, so that the higher coefficient of thermal expansion (CTE) of the stressor film 104 results in the stressor film exerting tensile stress on the oxide layer at the tip of the microfracture 103. Preferably, deposition is performed at room temperature (i.e., 20° C. to 40° C.), whereas fracture propagation is performed at a temperature less than 20° C. In one or more embodiments, fracture propagation occurs at a temperature of less than 206 K. In other embodiments, fracture propagation occurs at a temperature from 175 K to 130 K. In yet another embodiment, fracture propagation occurs at a temperature of 77 K or less. Notably, layer thicknesses and relative CTEs are selected to provide a margin of safety between normal operating temperatures and the lower temperature range that will cause tensile stress sufficient to induce fracture propagation.

When a temperature that is less than room temperature is used, the less than room temperature fracture propagation process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When fracture propagation is performed at a temperature that is below room temperature, the fractured structure is returned to room temperature by allowing the structure to slowly warm up to room temperature by allowing the same to stand at room temperature. Alternatively, the fractured structure can be heated up to room temperature utilizing any heating means.

In one or more embodiments, the dimensions of the stressor film sections 104 are such that thermal strain mismatch between the stressor film sections 104 and the oxide layer 102 induces lateral cracking of the oxide layer across the microfracture 103, rather than spalling of the oxide layer 102 from the substrate 101.

FIG. 2 depicts a cross-section view of the semiconductor wafer 100 with the sections of the stressor film 104 deposited onto the oxide layer 102 and the nanochannel 106 formed in the oxide layer 102 between the sections of the stressor film 104. In one or more embodiments, the nanochannel 106 does not penetrate to full depth of the oxide layer 102. In other embodiments, the nanochannel 106 penetrates through the oxide layer 102 to contact active circuitry 114 of the semiconductor 100, but does not penetrate the active circuitry. As mentioned herein, the penetration depth of the nanochannel 106 can be adjusted by (i) controlling a depth to which the microfracture 103 is formed in the oxide layer (this could also be a nitride or other dielectric or semiconductor layer) 102; (ii) controlling a width of each section of the stressor film 104 along an upper surface of the oxide layer 102; and (iii) controlling a thickness of the stressor film 104. Additionally, penetration depth of the nanochannel 106 is limited by the substrate 101 having a larger value of fracture toughness Kw than does the oxide layer 102. Other factors can also include i) the stress of the stressor layer, ii) the Young's modulus of the stress layer and the crack layer.

FIG. 3 depicts a cross-section view of another exemplary embodiment in which a semiconductor wafer 300 has an oxide layer 301 deposited between stressor film 304 so that tensile stress on the stressor film propagates a microfracture to form a nanochannel 306 in the oxide layer 301.

FIG. 4 depicts a cross-section view of another exemplary embodiment in which a semiconductor wafer 400 has stressor film 404 partially embedded into an oxide layer 401 so that tensile stress on the stressor film propagates a microfracture to form a nanochannel 406 in the oxide layer 401.

FIG. 5 depicts a cross-section view of yet another exemplary embodiment in which a semiconductor wafer 500 includes multiple stacked layers of oxide 501 and stressor film 504 so that tensile stress on the stressor film propagates a microfracture to form a nanochannel 506 through the oxide layer 501.

Figure 6:
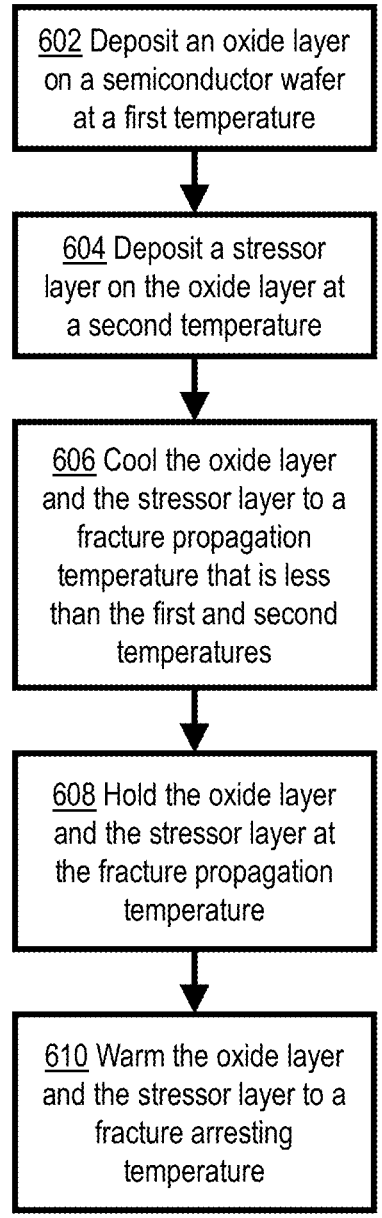
FIG. 6 depicts steps of a method for fabricating a nanochannel according to exemplary embodiments.

FIG. 6 depicts steps of a method 600 for fabricating a nanochannel according to exemplary embodiments. At 602, deposit the oxide layer 102 onto a semiconductor wafer at a first temperature, e.g., at room temperature as discussed above. At 604, deposit the stressor film 104 onto the oxide layer 102 at a second temperature, which may match the first temperature, e.g., at room temperature as discussed above. At 606, cool the oxide layer 102 and the stressor film 104 to a fracture propagation temperature that is less than the first and second temperatures. At 608, hold the oxide layer 102 and the stressor film 104 at the fracture propagation temperature while the nanofracture 106 propagates from the microfracture 103 as directed by the shape of the stressor film 104. At 610, warm the stressor film 104 and the oxide layer 102 to a fracture arresting temperature that is greater than the fracture propagation temperature, e.g., to the first or second temperature or to a normal operating temperature that may be less than or greater than the first or second temperature.

It will be appreciated that margins of safety are provided between the fracture propagation temperature, the fracture arresting temperature, and the normal operating temperature, such that fracture propagation will reliably occur when the semiconductor wafer 100 is cooled to the fracture propagation and will reliably stop when the semiconductor wafer 100 is warmed to the fracture arresting temperature, and such that the fracture arresting temperature is appreciably less than the normal operating temperature.

Given the discussion thus far, it will be appreciated that, in general terms, an exemplary method for fabricating a nanochannel in an oxide layer on a semiconductor wafer, according to an aspect of the invention, includes depositing the oxide layer onto the wafer at a first temperature; forming a microfracture in the oxide layer; depositing a stressor film onto the oxide layer in sections that adjoin the microfracture at opposite sides, at a second temperature; cooling the oxide layer and the stressor film to a fracture propagation temperature that is less than the first and second temperatures; and holding the oxide layer and the stressor film at the fracture propagation temperature while the nanochannel propagates as a fracture from the microfracture as directed by the shape of the stressor film.

In one or more embodiments, the first temperature is between 20 degrees Celsius and 40 degrees Celsius. In one or more embodiments, the second temperature also is between 20 degrees Celsius and 40 degrees Celsius. In one or more embodiments, the fracture propagation temperature is less than 206 Kelvin. In one or more embodiments, the fracture propagation temperature is from 175 Kelvin to 130 Kelvin. In one or more embodiments, the fracture propagation temperature is less than 77 Kelvin.

In one or more embodiments, the exemplary method also includes warming the stressor film and the oxide layer to a fracture arresting temperature that is greater than the fracture propagation temperature. In one or more embodiments, the fracture arresting temperature is less than 20 degrees Celsius. Note, however, that other embodiments could use other fracture arresting temperatures.

According to another aspect of the invention, a combined nanofluidic and integrated circuit device includes a semiconductor wafer that includes a substrate with active circuitry formed in the substrate; an oxide layer deposited adjacent the active circuitry; a stressor film deposited onto or into the oxide layer in sections, wherein the stressor film has a higher coefficient of thermal expansion than the oxide layer has; and a nanochannel formed in the oxide layer between the sections of the stressor film. In one or more embodiments, the device also includes a first fluid cavity formed in the oxide layer at a first side of the stressor film and a second fluid cavity formed in the oxide layer at a second side of the stressor film, and the nanochannel fluidly connects the first fluid cavity to the second fluid cavity.

In one or more embodiments, the nanochannel is formed to less than full depth of the oxide layer. In other embodiments, the nanochannel is formed to full depth of the oxide layer and contacts but does not penetrate the active circuitry.

In one or more embodiments, the depth of the stressor film parallel to the nanochannel is less than the depth of the nanochannel and the width of the stressor film perpendicular to the nanochannel is sufficient to cause the nanochannel to penetrate the full depth of the oxide layer.

In one or more embodiments, the fracture toughness of the oxide layer is less than the fracture toughness of the stressor film. In one or more embodiments, the fracture toughness of the oxide layer is less than the fracture toughness of the substrate.

In one or more embodiments, the coefficient of thermal expansion of the oxide layer is less than the coefficient of thermal expansion of the substrate. In one or more embodiments, the coefficient of thermal expansion of the stressor film is greater than the coefficient of thermal expansion of the substrate.

In one or more embodiments, the dimensions of the stressor film are such as to induce lateral cracking in the oxide film rather than inducing spalling of the oxide film from the substrate.

In one or more embodiments, the depth of the stressor film is less than the depth of the oxide layer.

In one or more embodiments, the stressor film is embedded into the oxide layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a nanochannel in an oxide layer on a semiconductor wafer, comprising:
   depositing the oxide layer onto the wafer at a first temperature;
   forming a microfracture in the oxide layer;
   depositing a stressor film onto the oxide layer in sections that adjoin the microfracture at opposite sides, at a second temperature;
   cooling the oxide layer and the stressor film to a fracture propagation temperature that is less than the first and second temperatures; and
   holding the oxide layer and the stressor film at the fracture propagation temperature while the nanochannel propagates as a fracture from the microfracture as directed by the shape of the stressor film.

2. The method of claim 1 wherein the first temperature is between 20 degrees Celsius and 40 degrees Celsius.

3. The method of claim 1 wherein the second temperature is between 20 degrees Celsius and 40 degrees Celsius.

4. The method of claim 1 wherein the fracture propagation temperature is less than 206 Kelvin.

5. The method of claim 4 wherein the fracture propagation temperature is from 175 Kelvin to 130 Kelvin.

6. The method of claim 4 wherein the fracture propagation temperature is less than 77 Kelvin.

7. The method of claim 1, further comprising:
   warming the stressor film and the oxide layer to a fracture arresting temperature that is greater than the fracture propagation temperature.

8. The method of claim 7 wherein the fracture arresting temperature is less than 20 degrees Celsius.

9. A combined nanofluidic and integrated circuit device, comprising:
   a semiconductor wafer comprising a substrate with active circuitry formed in the substrate;
   an oxide layer deposited adjacent the active circuitry;
   a stressor film deposited onto or into the oxide layer in sections, wherein the stressor film has a higher coefficient of thermal expansion than the oxide layer has; and
   a nanochannel formed in the oxide layer between the sections of the stressor film.

10. The device of claim 9, further comprising:
    a first fluid cavity formed in the oxide layer at a first side of the stressor film; and
    a second fluid cavity formed in the oxide layer at a second side of the stressor film,
    wherein the nanochannel fluidly connects the first fluid cavity to the second fluid cavity.

11. The device of claim 9, wherein the nanochannel is formed to less than full depth of the oxide layer.

12. The device of claim 9, wherein the nanochannel is formed to full depth of the oxide layer and contacts but does not penetrate the active circuitry.

13. The device of claim 9, wherein the depth of the stressor film parallel to the nanochannel is less than the depth of the nanochannel and the width of the stressor film perpendicular to the nanochannel is sufficient to cause the nanochannel to penetrate the full depth of the oxide layer.

14. The device of claim 9 wherein the fracture toughness of the oxide layer is less than the fracture toughness of the stressor film.

15. The device of claim 9 wherein the fracture toughness of the oxide layer is less than the fracture toughness of the substrate.

16. The device of claim 9 wherein the coefficient of thermal expansion of the oxide layer is less than the coefficient of thermal expansion of the substrate.

17. The device of claim 9 wherein the coefficient of thermal expansion of the stressor film is greater than the coefficient of thermal expansion of the substrate.

18. The device of claim 9 wherein the dimensions of the stressor film are such as to induce lateral cracking in the oxide film rather than inducing spalling of the oxide film from the substrate.

19. The device of claim 9 wherein the depth of the stressor film is less than the depth of the oxide layer.

20. The device of claim 9 wherein the stressor film is embedded into the oxide layer.

\* \* \* \* \*